(12) United States Patent
Lin et al.

(10) Patent No.: US 8,101,522 B2
(45) Date of Patent: Jan. 24, 2012

(54) SILICON SUBSTRATE HAVING NANOSTRUCTURES AND METHOD FOR PRODUCING THE SAME AND APPLICATION THEREOF

(75) Inventors: Ching-Fuh Lin, Taipei (TW); Shu-Jia Syu, Taipei (TW)

(73) Assignee: National Taiwan University, Taipei (TW)

( * ) Notice: Subject to any disclaimer, the term of this patent is extended or adjusted under 35 U.S.C. 154(b) by 170 days.

(21) Appl. No.: 12/713,094

(22) Filed: Feb. 25, 2010

(65) Prior Publication Data
US 2011/0204489 A1    Aug. 25, 2011

(51) Int. Cl.
*H01L 21/302* (2006.01)
(52) U.S. Cl. ........ 438/689; 438/162; 438/478; 438/704; 438/758
(58) Field of Classification Search ............ 438/162, 438/478, 689–704, 758–759, E29.024, E21.09
See application file for complete search history.

(56) References Cited

U.S. PATENT DOCUMENTS

| 7,259,101 | B2 * | 8/2007 | Zurcher et al. ............... 438/700 |
| 7,348,206 | B2 * | 3/2008 | Bocian et al. ................. 438/99 |
| 7,943,531 | B2 * | 5/2011 | Nemani et al. ............... 438/787 |
| 2005/0104163 | A1 | 5/2005 | Weber et al. |
| 2006/0115648 | A1 | 6/2006 | Chen |
| 2006/0272061 | A1 | 11/2006 | Wei et al. |
| 2007/0166899 | A1 | 7/2007 | Yao et al. |

OTHER PUBLICATIONS

Peng et al., "Fabrication of Single-Crystalline Silicon Nanowires by Scratching a Silicon Surface with Catalytic Metal Particles", Advanced Functional Materials, 2006, 16, pp. 387-394.

* cited by examiner

*Primary Examiner* — Cuong Q Nguyen
(74) *Attorney, Agent, or Firm* — Stout, Uxa, Buyan & Mullins, LLP

(57) ABSTRACT

A method for forming a silicon substrate having a multiple silicon nanostructures includes the steps of: providing a silicon substrate; forming an oxidization layer on the silicon substrate; immersing the silicon substrate in a fluoride solution including metal ions, thereby depositing a plurality of metal nanostructures on the silicon substrate; and immersing the silicon substrate in an etching solution to etch the silicon under the metal nanostructures, the unetched silicon forming the silicon nanostructures.

19 Claims, 7 Drawing Sheets

SILICON SUBSTRATE HAVING NANOSTRUCTURES AND METHOD FOR PRODUCING THE SAME AND APPLICATION THEREOF

BACKGROUND OF THE INVENTION

1. Field of the Invention

The present invention relates to semiconductor substrates, and more particularly, relates to silicon substrates having nanostructures.

2. Description of Related Art

Anti-reflection layers are typically employed above silicon layers of optoelectronics, such as solar cells, detectors, and photodiodes, to maximize the amount of light absorbed in the silicon layers. Increasingly greater amounts of light absorbed of course tend to promote more efficient optoelectronics. As evidenced by the reflective index of silicon being a relatively high 3.5 to 4, the reflectivity of silicon layers is more than 30%; therefore, anti-reflection layers can be highly beneficial for retarding large amounts of light from being reflected back from the silicon surface. In particular implementations, anti-reflection layers typically employ anti-reflection films or various nanostructures textured on silicon surfaces to reduce the light reflected off the silicon surface.

The various nanostructures, such as nanowires, nanoholes, nanocolumns, nanoneedles, and the like, reduce reflection losses by increasing the light path whereby the light strikes the silicon multiple times, and by decreasing the reflective index whereby more light is confined within the silicon. However, nanostructures having too large of a surface area can cause the carrier recombination to be increased, thus lowering the efficiency of the optoelectronics.

Therefore, a demand exists in the prior art for silicon substrates having nanostructures that maximize the amount of light absorbed in the silicon layer while not lowering the efficiency of the optoelectronics. Another demand is for the nanostructures to provide excellent anti-reflection performance over a wide wavelength range, preferably, in the substantially whole wavelength range comprising the wavelengths of ultraviolet, infrared, and visible light.

Accordingly, it would be advantageous to provide silicon substrates having nanostructures, and forming methods and applications thereof, that can satisfy the above demands and resolve the problems of the prior art.

SUMMARY OF THE INVENTION

An object of the present invention is to provide silicon substrates having silicon nanostructures, and their forming methods and applications. With regard to the object the nanostructures can provide excellent anti-reflection performance over a wide wavelength range, preferably, in the substantially whole wavelength range comprising the wavelengths of ultraviolet, infrared, and visible light. In further regard to the object the nanostructure surface areas will not be increased dramatically, and the efficiency of the optoelectronic having the silicon nanostructures will not be decreased.

According to the object, one embodiment of the present invention provides a method for forming a silicon substrate having a plurality of silicon nanostructures comprising the steps of: providing a silicon substrate; forming an oxidization layer on the silicon substrate; immersing the silicon substrate in a fluoride solution comprising metal ions, whereby the oxidation layer is etched by the fluoride solution, then (e.g., followed by) exposing a clean surface on the silicon substrate with unoccupied sites and occupied sites of Si—H, whereby metal ions are reduced and deposited on the unoccupied sites of the silicon substrate to form metal nanostructures; and immersing the silicon substrate in an etching solution to etch the silicon under the metal nanostructures, the unetched silicon forming the silicon nanostructures.

According to the object, one embodiment of the present invention provides a silicon substrate comprising a plurality of silicon nanostructures, wherein the density of the silicon nanostructures is greater than or equal to 20 pieces per square micrometer.

DESCRIPTION OF THE PREFERRED EMBODIMENT

Reference will now be made in detail to specific embodiments of the invention. Examples of these embodiments are illustrated in the accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known components and process operations are not described in detail in order not to obscure unnecessarily the present invention. While the drawings are illustrated in detail, it is appreciated that the quantity of the disclosed components may be greater or less than that disclosed, except for instances expressly restricting the amount of the components.

Figure 1A:
FIG. 1A to FIG. 1H show a method for forming a silicon substrate having a plurality of silicon nanostructures according to one embodiment of the present invention.
Figure 1B:
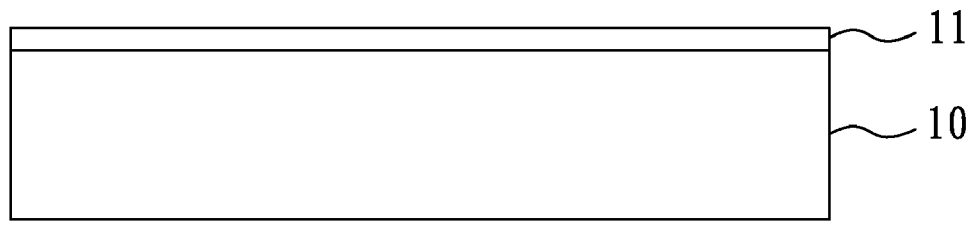

FIG. 1A to FIG. 1H show a method for forming a silicon substrate having a plurality of silicon nanostructures according to one embodiment of the present invention. Referring to FIG. 1A, a silicon substrate 10 is provided. The silicon substrate 10 may be n-type or p-type of single-crystalline, polycrystalline, or amorphous silicon-based substrate, and may be cleaned by one or more solvents or water before other steps are performed. In this exemplary embodiment, the silicon substrate 10 is n-type with a resistivity between 1 and 10 ohm-cm. Referring to FIG. 1B, an oxidization layer 11 with a thickness of about 1 nm to 1 μm is formed on the silicon substrate 10 by proper or suitable methods. For example, the silicon substrate 10 may be cleaned using a Buffer Oxidation Etchant (BOE) and then immersed in a strong oxidation solution to form the oxidization layer 11. In this exemplary embodiment, sulfuric acid ($H_2SO_4$) and hydrogen peroxide ($H_2O_2$) are employed as the strong oxidation solution to form the oxidization layer 11 on the silicon substrate 10, and then de-ionized water is used to clean the oxidization layer 11. Note that in another embodiment the silicon substrate 10 may be exposed to air for several hours resulting in the oxidization layer 11 being naturally formed, and other embodiments of the present invention may employ thermal oxidation, plasma evaporation, sputtering, and spin coating methods to form the oxidization layer 11 except for the above-mentioned chemical oxidation and native oxidation methods.

Figure 1C:
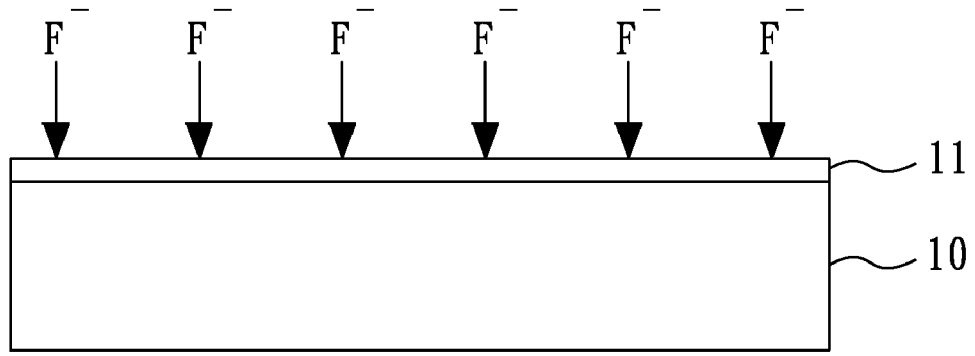

The oxidization layer 11 may comprise one or more of silicon oxide, silicon dioxide, silicon nitride, silicon oxynitride, and the like that can be etched by a fluoride solution, as will be discussed below. Referring to FIG. 1C, the silicon substrate 10 is immersed in a fluoride solution comprising metal ions, which may comprise ions of one or more of gold (Au), silver (Ag), copper (Cu), platinum (Pt), iron (Fe), or combination thereof having various valence charges. In this embodiment, the fluoride solution comprises hydrofluoric acid (HF) and silver nitrate ($AgNO_3$). Accordingly, the fluorine ions of hydrofluoric acid will etch the oxidization layer 11.

Figure 1D:
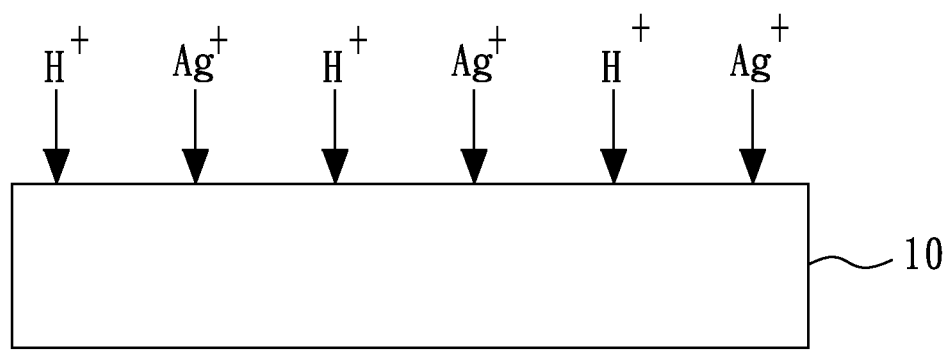
Figure 1E:
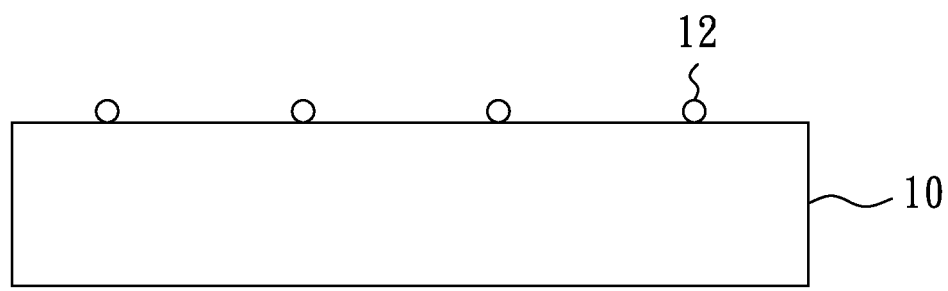
Figure 1F:
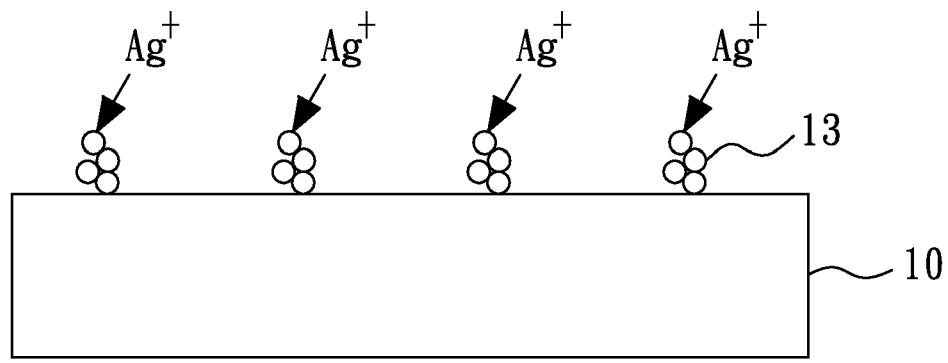

Referring to FIG. 1D, after the oxidization layer 11 is etched, Si—H bonds will be formed on some locations of the silicon substrate, and metal ions will be deposited on locations unoccupied by the Si—H bonds. Referring to FIG. 1E, the metal ions (such as silver ions) will be reduced and deposited in silicon surface regions unoccupied by the Si—H bonds and form metal nanoparticles 12. Turning to FIG. 1F, the deposition and accumulation of additional metal ions on the metal nanoparticles 12 as a continual reduction forms silver nanoislands and/or nanomeshes 13. In this context of the present invention, "metal nanostructures" refers to structures formed by the deposited metals with one or more of particle shapes, island shapes, mesh shapes, and the like.

Figure 1G:
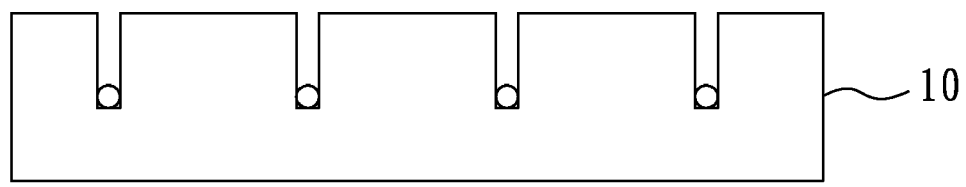
Figure 1H:
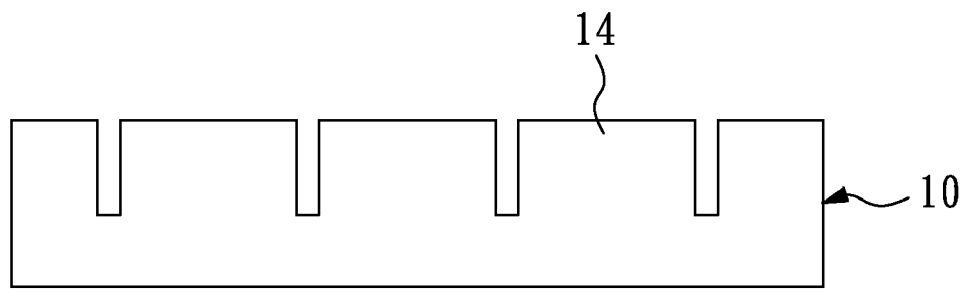

With reference to FIG. 1G, after the metal nanostructures 12/13 are formed on the surface of the silicon substrate 10, the silicon substrate 10 is immersed in an etching solution. The etching solution may be the same as or different from the fluoride solution. In this exemplary embodiment, the etching solution is the same as the fluoride solution, which comprises hydrofluoric acid (HF) and silver nitrate ($AgNO_3$). In another embodiment of the present invention, the etching solution may comprise hydrogen peroxide ($H_2O_2$) and hydrofluoric acid (HF) or any etchant to which the Si—H bonds are substantially resistant and that is capable of etching the silicon with a fast rate. Accordingly, the silicon surface occupied by the Si—H bonds is protected and not etched; in contrast, the silicon surface occupied by the metal nanostructures 12/13 is not protected by the Si—H bonds and is etched. Referring to FIG. 1H, the metal nanostructures 12 are removed resulting in the remaining (unetched) silicon forming (e.g., constituting) silicon nanostructures 14 of the silicon substrate 10. The morphology of the silicon nanostructures 14 may comprise one or more of nanowires, nanosheets, nanoribbons, and nanoholes.

The forming mechanism of the silicon nanostructures 14 is a galvanic displacement reaction characterizable by the metal ions proceeding the cathodic process and the silicon proceeding the anodic process. Because the reduction of metal ions and the oxidation of Si atoms occur simultaneously at the silicon surface, the distribution and morphology of the metal nanostructures 12/13, such as Ag nanoparticles, greatly affect the morphology of etched nanostructures 14 of the silicon substrate 10. The density and uniformity of the nanostructures 14 depend on the distribution pattern of the metal nanostructures 12/13 on the silicon substrate 10. Furthermore, the density and the size of the silicon nanostructures 14 are also closely related to the immersing time and temperature in the fluoride solution and the etching solution. If a lower etching temperature is used, a lower etching rate of the oxidization layer 11 and the silicon nanostructures 14 will be obtained. Additionally, varying the deposition parameters of the oxidization layer may also affect the density and size of the silicon nanostructures 14. In the processes of the present invention, the depositing time and temperature of the metal nanostructures 12/13 are respectively controlled at about 1 second to 10 minutes and 20° C. to 100° C. In addition, the etching temperature for forming the nanostructures of the silicon substrate may also be controlled at about 20° C. to 100° C., with etching times of the silicon nanostructures depending on the needed length and thickness dimensions of the silicon nanostructures 14. Thus, the etching times may be determined by one or more of a needed length dimension and a needed thickness dimension of the silicon nanostructures.

Figure 2:
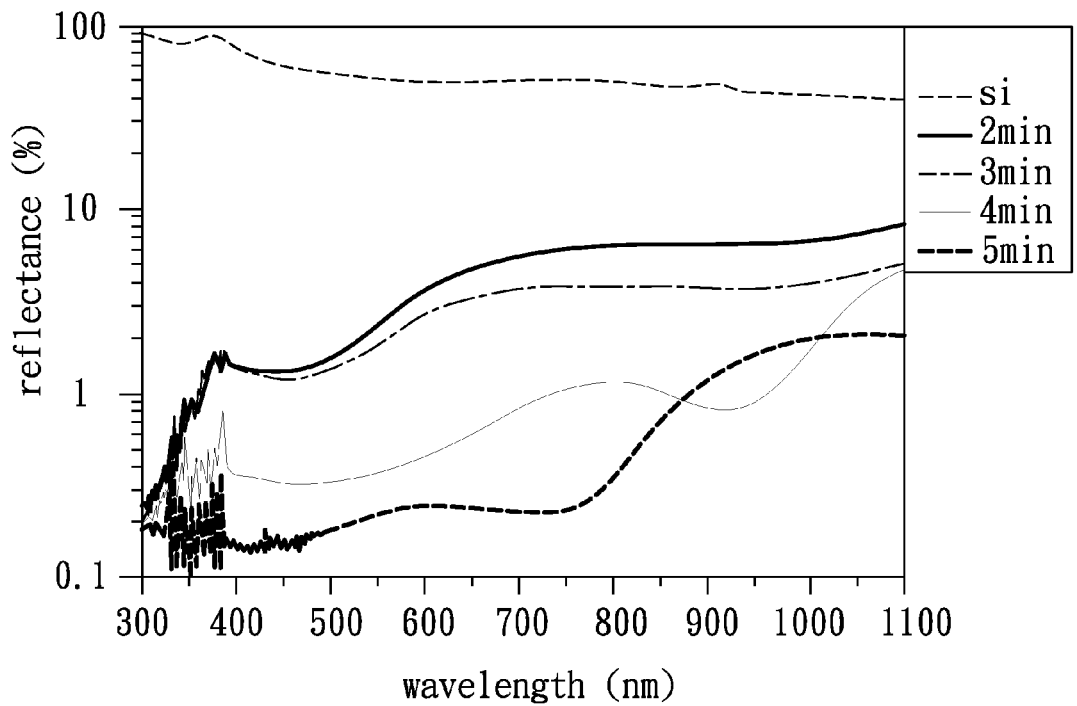
FIG. 2 shows reflectance plots of some silicon substrates having nanostructures textured by the method of the present invention.

FIG. 2 shows reflectance plots for four silicon substrates each having nanostructures textured by the method of the present invention in which the etching solution comprises hydrofluoric acid (HF) and hydrogen peroxide ($H_2O_2$) and the etching times are controlled at 2, 3, 4, and 5 minutes respectively, and further shows as a comparative result the reflectance of a general silicon substrate, i.e., a silicon substrate without textured nanostructures (denoted by "Si"). After etching of the silicon substrates by the etching solution for 2, 3, 4, and 5 minutes, a scanning electron microscope can be used to show that the prepared nanostructures of the silicon substrate have average lengths of about 0.285 μm, 0.308 μm, 0.549 μm, and 0.87 μm respectively. The scanning electron microscope also shows that the prepared silicon nanostructures substantially have nanowire shapes. As shown in FIG. 2, each of the four prepared nanowires has a reflectance less than 10% over the wide wavelength range from 300 to 1100 nm. Particularly, the sample with a length of about 0.549 μm has a reflectance less than 1% over a wide wavelength range from 300 to 972 nm, and the sample with a length of about 0.87 μm has a reflectance less than 1% over a wide wavelength range from 300 to 8822 nm. Compared with the unetched, untextured silicon substrate, the nanostructures help to significantly decrease the silicon reflectance.

Figure 3:
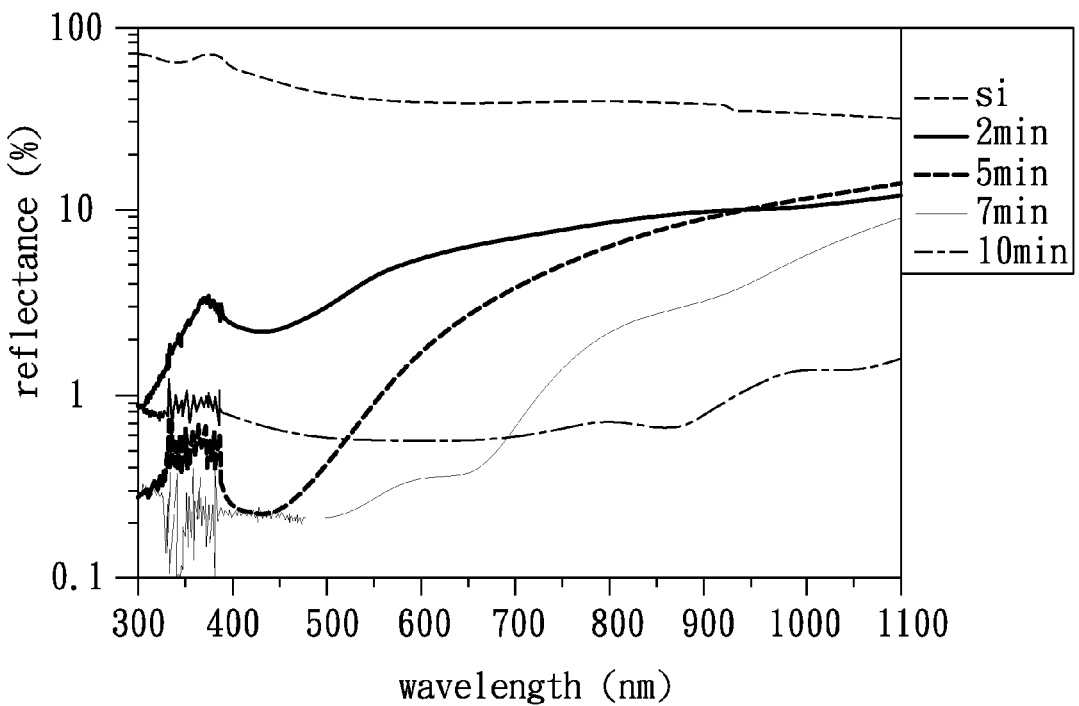
FIG. 3 shows reflectance plots of some silicon substrates having nanostructures textured by a comparative method.

FIG. 3 shows reflectance plots for four silicon substrates each having a plurality of silicon nanostructures textured by a comparative method in which each silicon substrate is cleaned by acetone, methanol, an aqueous solution containing sulfuric acid ($H_2SO_4$) and hydrogen peroxide ($H_2O_2$), buffer oxidation etchant (BOE), and de-ionized water in sequence, followed by each being immediately immersed in a fluoride acid solution comprising hydrofluoric acid (HF) and silver nitrate ($AgNO_3$) for 2, 5, 7, and 10 minutes respectively. The reflectance of a general silicon substrate (denoted by "Si") is also shown for comparison. Scanning electron microscope imaging shows that the prepared nanowires corresponding to the 2, 5, 7, and 10 minute etches have average lengths of about 0.29 μm, 0.763 μm, 1.161 μm, and 1.812 μm respectively. As shown in FIG. 3, only the sample that was etched for 10 minutes has a reflectance less than 1% over the wide wavelength range from 300 to 1100 nm; however, this sample has a length dimension of about 1.812 μm that will significantly increase the surface area, causing the carrier recombination rate to be increased, and thus decreasing the efficiency of the optoelectronic.

Figure 4A:
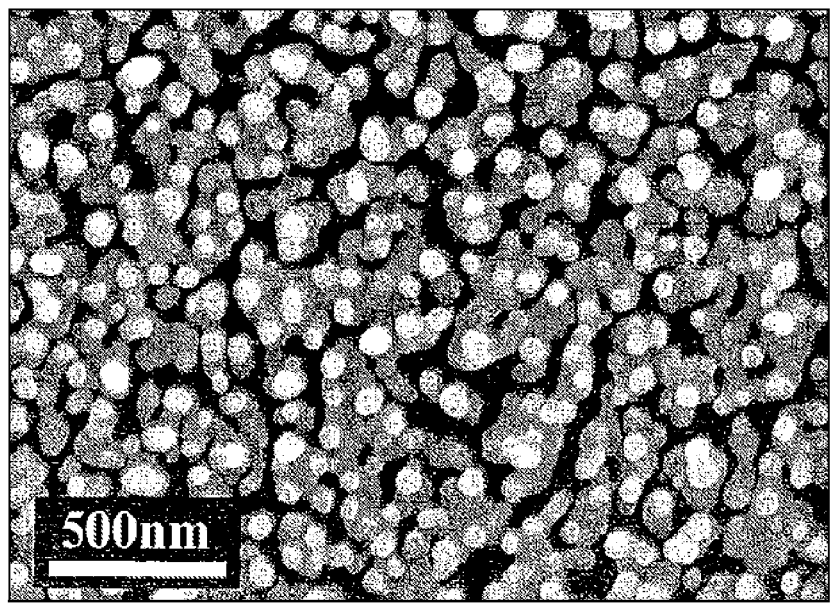
FIG. 4A shows a distribution of metal nanostructures produced by the above-mentioned comparative method.
Figure 5A:
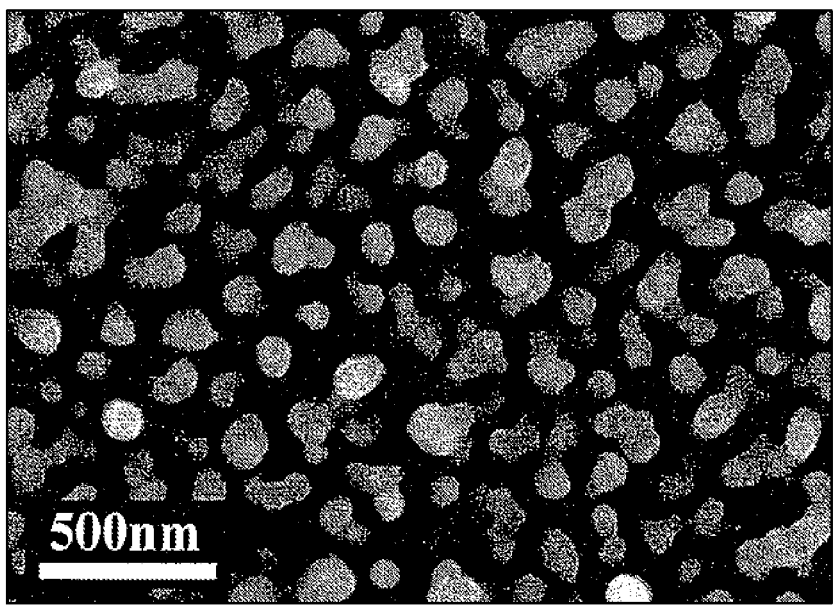
FIG. 5A shows a distribution of metal nanostructures produced by one of the embodiments shown in FIG. 1.
Figure 4B:
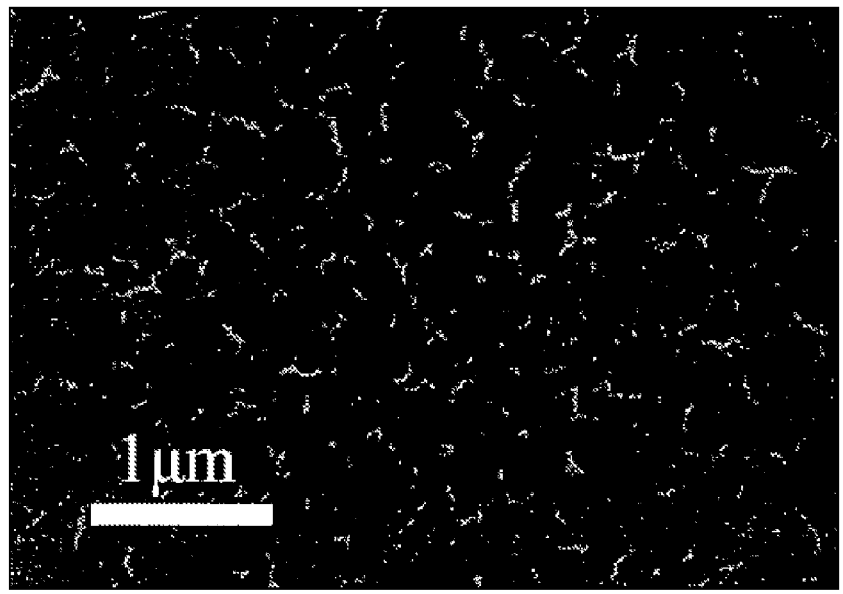
FIG. 4B shows silicon nanostructures prepared with the metal nanostructures of FIG. 4A.
Figure 5B:
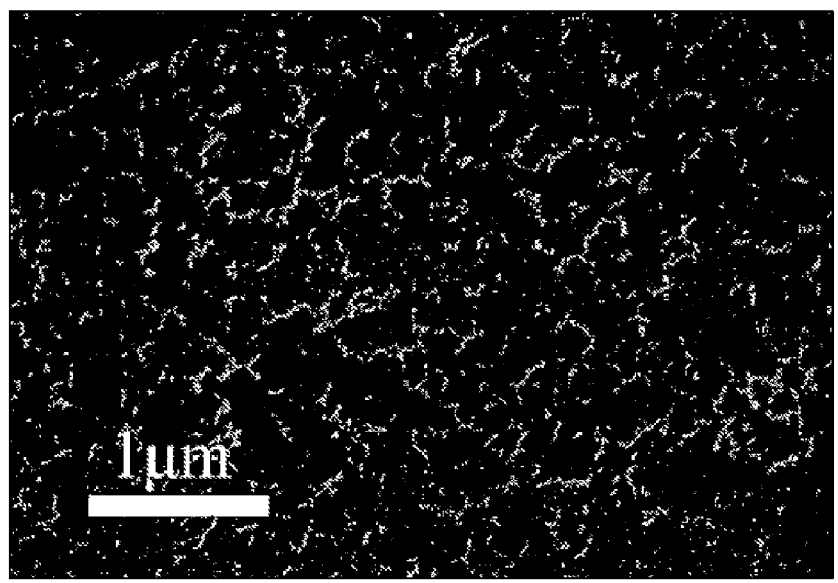
FIG. 5B shows silicon nanostructures prepared with the metal nanostructures of FIG. 5A.

The comparative method provides silicon substrates with reflectances that cannot be less than 1% over a wide wavelength range. As mentioned before, the distribution of the metal nanostructures will determine the density and size of the silicon nanostructures. FIG. 4A shows a distribution of the metal nanostructures produced by the above-mentioned comparative method, and FIG. 4B shows silicon nanostructures prepared with the metal nanostructures of FIG. 4A. FIG. 5A shows a distribution of metal nanostructures produced by one of the embodiments shown in FIG. 1, and FIG. 5B shows silicon nanostructures prepared with the metal nanostructures of FIG. 5A. It can be recognized that the metal nanostructures produced by the comparative method have a larger volume than that of the present invention, and because the silicon surface occupied by the metal nanostructures will be etched, the remaining silicon will form sparse silicon nanostructures. In contrast, the method of the present invention can produce dense silicon nanostructures due to the smaller volume and denser distribution of the metal nanostructures. According to embodiments of the present invention, the density of the silicon nanostructures is greater than or equal to 20 pieces per square of micrometer (20 pieces/$\mu m^2$). Accordingly, the method of the present invention produces silicon nanostructures with a greater density that can increase the light path and confine more light within the silicon.

Figure 6A:
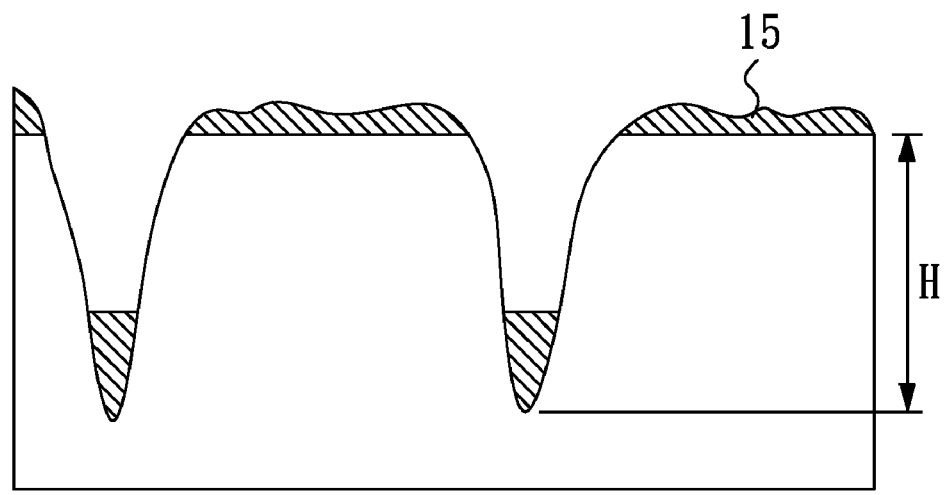
FIG. 6A and FIG. 6B elucidate, respectively, nanostructures produced by the comparative method and by the method of the present invention.
Figure 6B:
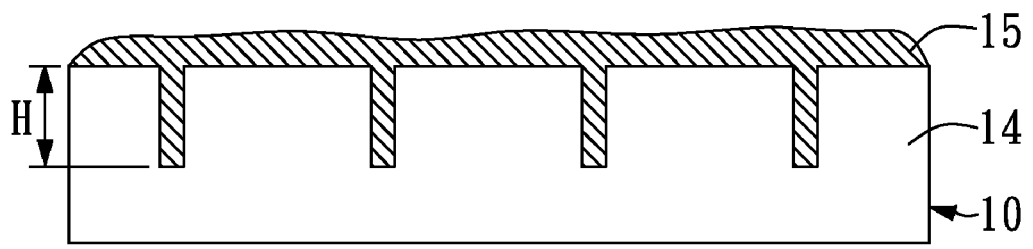

In addition, the present invention has a shorter etching time than that of the comparative method and provides a better anti-reflection effect over a substantially whole wavelength range. For the sake of comparison, FIG. 6A and FIG. 6B show prepared silicon nanostructures of the comparative method and the present invention respectively, with FIG. 6A showing the silicon nanostructures produced by the comparative method and FIG. 6B showing the silicon nanostructures produced by the method of the present invention. For achieving a satisfactory anti-reflection effect, the comparative method employs a longer etching time than that of the present invention; however, the longer etching time causes the thickness H of the nanostructures to be too deep and thus results in the carrier recombination rate being increased. In addition, as shown in FIG. 6A, when an electrode is deposited on the nanostructures for forming an optoelectronic, the sparsely distributed silicon nanostructures may cause the electrode 15 to be discontinuous. In contrast, as shown in FIG. 6B, silicon nanostructures provided by the present invention can overcome the above deficiencies, and when an electrode 15 is deposited on the nanostructures for forming an optoelectronic, the ensuing structure may result in a continuous electrode 15.

Accordingly, one embodiment of the present invention provides a silicon substrate having nanostructures, wherein the density of the silicon nanostructures is greater than or equal to 20 pieces per square of micrometer. In one example, the silicon nanostructures are shaped as nanowires with an average length of about 0.5 µm to 0.9 µm. This silicon substrate can be produced by the method described in reference to FIGS. 1A to 1H, and features of the silicon substrate and the silicon nanostructures may be the same as or correspond to those in the description of FIGS. 1A to 1H, further details of which are omitted.

In addition, the silicon substrate having nanostructures may be applied to an optoelectronic, such as a solar cell, detector, photodiode, and the like. When the silicon substrate having nanostructures is applied to an optoelectronic, a first electrode is arranged above the silicon substrate, a second electrode is arranged below the silicon substrate, and one or more semiconductor layers may be arranged between the second electrode and the silicon substrate.

Although specific embodiments have been illustrated and described, it will be appreciated by those skilled in the art that various modifications may be made without departing from the scope of the present invention, which is intended to be limited solely by the appended claims.

What is claimed is:

1. A method for forming a silicon substrate having a plurality of silicon nanostructures, comprising the steps of:
providing a silicon substrate;
forming an oxidization layer on said silicon substrate;
immersing said silicon substrate in a fluoride solution comprising metal ions, whereby said oxidation layer is etched by said fluoride solution, followed by exposing a clean surface on said silicon substrate with unoccupied sites and occupied sites of Si—H, whereby metal ions are reduced and deposited on the unoccupied sites of said silicon substrate to form metal nanostructures; and
immersing said silicon substrate in an etching solution to etch the silicon under said metal nanostructures, the unetched silicon forming said silicon nanostructures.

2. The method as recited in claim 1, wherein said silicon substrate comprises a single-crystalline, poly-crystalline, or amorphous silicon-based substrate.

3. The method as recited in claim 1, wherein said oxidization layer comprises one or more of silicon oxide, silicon dioxide, silicon nitride, and silicon oxynitride that can be etched by said fluoride solution.

4. The method as recited in claim 1, wherein said oxidization layer is formed by a chemical oxidation method.

5. The method as recited in claim 1, wherein said oxidization layer is formed by a thermal oxidation, plasma evaporation, sputtering, spin coating, or native oxidation method.

6. The method as recited in claim 1, wherein said oxidization layer has a thickness of about 1 nm to 1 µm.

7. The method as recited in claim 1, wherein the metal ions comprise ions of gold (Au), silver (Ag), copper (Cu), platinum (Pt), iron (Fe), or a combination thereof having various valence charges.

8. The method as recited in claim 1, wherein said etching solution is the same as said fluoride solution.

9. The method as recited in claim 8, wherein said etching solution comprises hydrofluoric acid (HF) and silver nitrate ($AgNO_3$).

10. The method as recited in claim 1, wherein said etching solution differs from said fluoride solution.

11. The method as recited in claim 10, wherein said fluoride solution comprises hydrofluoric acid (HF) and silver nitrate ($AgNO_3$) and said etching solution comprises hydrogen peroxide ($H_2O_2$) and hydrofluoric acid (HF).

12. The method as recited in claim 1, wherein the depositing temperature of said metal nanostructures is controlled at about 20° C. to 100° C.

13. The method as recited in claim 1, wherein the depositing time of said metal nanostructures is controlled at about 1 second to 10 minutes.

14. The method as recited in claim 1, wherein said metal nanostructures comprise one or more of nanoparticles, nanoislands, and nanomeshes.

15. The method as recited in claim 1, wherein the etching temperature for forming said silicon nanostructures is controlled at about 20° C. to 100° C.

16. The method as recited in claim 1, wherein the etching temperature for forming said silicon nanostructures is determined by one or more of a needed length dimension and a needed thickness dimension of the silicon nanostructures.

17. The method as recited in claim 1, wherein the morphology of said silicon nanostructures comprises one or more of nanowires, nanosheets, nanoribbons, and nanoholes.

18. The method as recited in claim 1, wherein the density of said silicon nanostructures is greater than or equal to 20 pieces per square micrometer.

19. The method as recited in claim 1, wherein the silicon substrate having the plurality of silicon nanostructures is used in an optoelectronics comprising one or more of the following items: a solar cell, a detector, and a photodiode.

* * * * *